(12) United States Patent
Rabary et al.

(10) Patent No.: US 8,487,704 B2
(45) Date of Patent: Jul. 16, 2013

(54) REFERENCE VOLTAGE GENERATOR FOR BIASING AN AMPLIFIER

(75) Inventors: Vincent Rabary, Champagnier (FR); Frédéric Goutti, Saint Egreve (FR); Robert Cittadini, Fontaine (FR); Alexandre Huffenus, Grenoble (FR); Gael Pillonnet, Lyons (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 13/228,313

(22) Filed: Sep. 8, 2011

(65) Prior Publication Data

US 2012/0126892 A1    May 24, 2012

(30) Foreign Application Priority Data

Sep. 8, 2010   (FR) ...................... 10 03584

(51) Int. Cl.
*H03F 3/04* (2006.01)
(52) U.S. Cl.
USPC .......................................... 330/296

(58) Field of Classification Search
USPC .................... 327/538; 330/127, 296
See application file for complete search history.

(56) References Cited

U.S. PATENT DOCUMENTS

| | | | |
|---|---|---|---|
| 6,476,677 B1 | 11/2002 | Komaili et al. | |
| 6,696,884 B1 | 2/2004 | Seven | |
| 7,742,347 B2 * | 6/2010 | Lee et al. | 365/189.09 |
| 2005/0083114 A1 | 4/2005 | Risbo | |
| 2007/0024365 A1 | 2/2007 | Ramaswamy et al. | |
| 2008/0024213 A1 | 1/2008 | Magrath | |

OTHER PUBLICATIONS

Neelakantan, K., "Signal-to-noise enhancement using delta modulation," J. Phys. E: Sci. Instrum., 16:278-282, 1983.

* cited by examiner

*Primary Examiner* — Steven J Mottola
(74) *Attorney, Agent, or Firm* — Seed IP Law Group PLLC (57) ABSTRACT

A method generates a reference voltage by steps including: generating a reference signal from a voltage source; generating a comparison signal of the reference signal with a voltage reference; sampling the comparison signal; adjusting a numerical value as a function of the result of the comparison and of the numerical value; and converting the current numerical value into a voltage corresponding to the reference voltage.

25 Claims, 4 Drawing Sheets

REFERENCE VOLTAGE GENERATOR FOR BIASING AN AMPLIFIER

BACKGROUND

1. Technical Field

The present disclosure relates to amplifiers and in particular to audio amplifiers with asymmetric supply. The present disclosure also relates, but not exclusively, to mobile telephony.

2. Description of the Related Art

Figure 1:
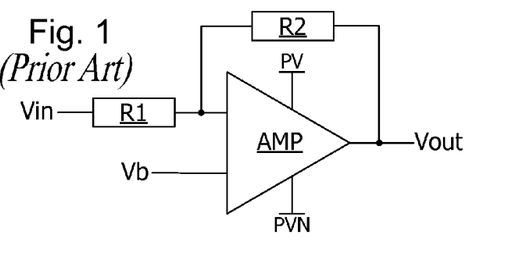
FIG. 1 previously described schematically shows a conventional amplification circuit, FIG. 2 previously described shows in the form of diagrams, different cases of amplifier voltage ranges, as a function of a bias voltage, FIG. 3 previously described schematically shows another conventional amplification circuit, FIG. 4 previously described schematically shows a conventional bias voltage generation circuit, connected to the amplification circuit of FIG. 1, FIG. 5 schematically shows a reference voltage generation circuit according to one embodiment, connected to the amplification circuit of FIG. 1, FIGS. 5A and 5B schematically show logic circuits of a reference voltage generation circuit.

Asymmetric supply amplifiers, and in particular those equipping mobile telephones, receive a continuous supply voltage. To maximize their dynamic, these amplifiers receive a biasing voltage equal to the supply voltage divided by two. FIG. 1 schematically shows an amplification circuit. In FIG. 1, the circuit comprises an amplifier AMP comprising two inputs and one output, and supplied between voltages PV and PVN. The signal to amplify Vin is input to the first of the two inputs by the intermediary of a resistor R1. A bias voltage Vb is input to the second input of the amplifier AMP. The first input is linked to the output of the amplifier AMP by the intermediary of a resistor R2. The output of the amplification circuit supplies an amplified signal Vout corresponding to the difference between the input signal Vin and the bias voltage Vb. The voltage PVN is for example equal to 0 V or −PV and the voltage Vb is for example equal to (PV−PVN)/2.

Figure 2:
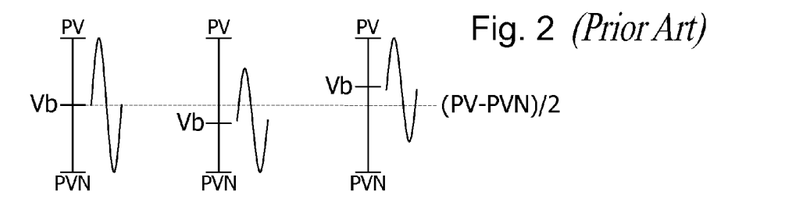

FIG. 2 shows, in the form of diagrams, three cases of adjustment of the bias voltage Vb. In a first case, the voltage Vb is adjusted to the median voltage equal to the difference between the supply voltages PV and PVN of circuit, divided by two (that is, (PV−PVN)/2). The voltage range of the amplifier is between the voltage PVN and the voltage PV. The voltage range of the amplifier is thus at a maximum. In a second case, the bias voltage is less than the median voltage (PV−PVN)/2. In a third case, the voltage Vb is greater than the voltage (PV−PVN)/2. To avoid a saturation of the amplifier leading to a distortion of the amplified signal Vout and knowing that the amplified signal cannot be less than PVN or greater than PV, the gain of the amplifier is adjusted in a manner such that the voltage extremes of the output signal remain between PVN and PV. The voltage range of the amplifier thus varies in the second case between PVN and 2(Vb−PVN) (<PV) and in the third case, between PV−2(PV−Vb) {that is, 2 Vb−PV (>PVN)} and PV. It thus appears that to maximize the voltage range of the amplifier, the bias voltage must be maintained at the median voltage of the supply voltages, that is (PV−PVN)/2.

Nevertheless, the supply voltage of a mobile telephone coming from a battery may vary greatly, in particular due to the battery charge and the active elements of the telephone. If the bias voltage Vb follows the median voltage of the supply voltages, it results that any variation of the voltage Vb is transmitted on output of the amplifier AMP with a gain equal to 1+R1/R2. However, the quality of an amplifier is mainly determined by the rejection ratio of the supply voltage PSRR (Power Supply Rejection Ratio), generally expressed in negative decibels (dB). The weaker the ratio PSRR (absolute value) of a circuit, the less the circuit is sensitive to supply voltage variations. The amplification circuit of FIG. 1 has a negative ratio PSRR of several dB. In the case where the gain of this circuit is equal to 1, the ratio PSRR is equal to −6 dB.

Figure 3:
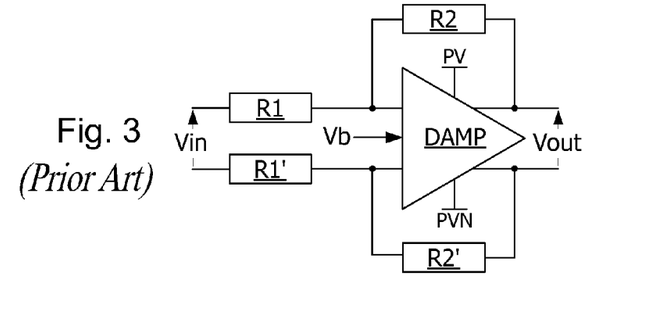

FIG. 3 shows a differential amplification circuit. In FIG. 3, the amplification circuit comprises a differential amplifier DAMP comprising three inputs and two outputs, and supplied between the voltages PV and PVN. The input signal Vin is supplied between two of the inputs by the intermediary of resistors R1, R1', and the bias voltage Vb is supplied to a third input. The input connected to the resistor R1 is linked to one output by the intermediary of a resistor R2. The input connected to the resistor R1' is linked to the other output by the intermediary of a resistor R2'. The output amplified signal is supplied between the two outputs. In this circuit, the variations of the bias voltage Vb are transmitted on output of the amplifier DAMP with an attenuation varying as a function of the matching of resistors R1 and R1' and of the matching of resistors R2 and R2'. Current technology allows a matching of resistors R1, R1' and R2, R2' within 0.1%. In these conditions, the ratio PSRR can reach approximately −66 dB.

Figure 4:
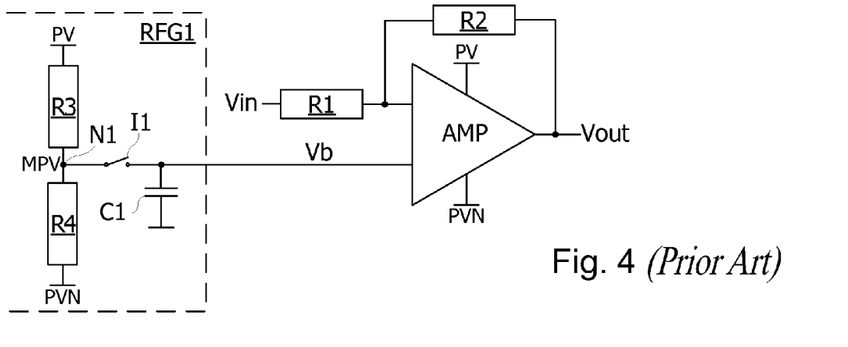

To increase the rejection of the supply voltage (that is to say, to diminish the ratio PSRR) from a certain frequency, it has been envisaged to generate the bias voltage Vb from supply voltages PV and PVN, with the aid of a voltage divider and of a low-pass filter. FIG. 4 shows a generation circuit RFG1 of the bias voltage Vb, connected to the amplification circuit of FIG. 1. The generation circuit RFG1 comprises two resistors R3, R4 and a capacitor C1. The two resistors R3, R4, are connected in series between the terminals to voltages PV and PVN of a voltage supply source, and have for example identical values so as to form a voltage divider by two. The voltage MPV at a junction node N1 between resistors R3, R4 is therefore substantially equal to the median voltage of supply voltages PV, PVN {that is, (PV−PVN)/2}, with a small difference depending on the matching of resistors R3 and R4. The voltage MPV at node N1 is filtered with the aid of a low-pass RC filter formed by the resistor R4 and the capacitor C1 connected between the node N1 and ground. The node N1 supplies the bias voltage Vb to the amplifier AMP. The ratio PSRR obtained is low at frequencies greater than the cut-off frequency of the low pass filter. It is therefore advantageous that the cut-off frequency of the filter is low. To this end, the greater the capacitance of the capacitor C1 and/or the value of the resistor R4, the weaker the cut-off frequency of the filter. Nevertheless, if it is desired to make the amplification circuit in an integrated circuit, it is not possible to form a high capacitance capacitor, unless a capacitor external to the integrated circuit is used.

To overcome this problem, it has been proposed, in particular in U.S. Pat. No. 6,696,884, to insert a controlled interrupter I1 between the node N1 and the capacitor C1, so as to form a sample and hold circuit. The interrupter is for example formed by a CMOS transistor, and controlled in a manner so as to open and close according to a certain sampling frequency. This disposition allows the ratio PSRR to be decreased to frequencies less than the sampling frequency. It is therefore advantageous that the sampling frequency be low. However, the leakage current during blocked periods (interrupter I1 open) is not negligible, which causes an undulation of the bias voltage Vb. It results that the lower the sampling frequency, the higher the undulation amplitude of the voltage Vb, and thus the more the ratio PSRR increases.

It may therefore be desired to make an amplifier that may be entirely integrated, and has a low (less than −70 dB) ratio PSRR in a large as possible useful frequency band.

BRIEF SUMMARY

Embodiments of the disclosure relate to a method of generating a reference voltage, comprising a step of generating a reference signal from a voltage source. According to one embodiment, the method comprises the steps of: comparing the reference signal with a voltage reference; adjusting a numerical value as a function of the result of the comparison and of the numerical value; and converting the numerical value into a voltage corresponding to the reference voltage.

According to one embodiment, the reference signal is generated by dividing a supply voltage by a constant factor.

According to one embodiment, the method comprises an initialization phase during which the reference voltage progressively reaches that of the reference signal, and an operational phase during which the reference voltage is maintained constant.

According to one embodiment, the method comprises steps of detecting a saturation of an amplifier biased by the reference voltage, and of adjusting the reference voltage in order to avoid a saturation of the amplifier.

According to one embodiment, the method comprises periodic steps of readjusting the reference voltage as a function of the reference signal.

Embodiments of the disclosure also relate to a method of amplifying a signal supplying an amplified signal, comprising the steps of: inputting, to an input of an integrator, a signal to amplify added to the amplified signal; inputting the output signal of the integrator to an input of a comparator receiving on another input a sawtooth signal, the amplified signal being obtained from an output signal of the comparator. According to one embodiment, the method comprises the steps of generating a reference voltage in conformance with the above-described method, and inputting the reference voltage to an input of the integrator.

According to one embodiment, the method comprises steps of generating the sawtooth signal centered on the reference signal, adding to the output signal of the integrator of the reference signal, and inputting the resulting signal to the input of the comparator.

According to one embodiment, the method comprises steps of supplying the output signal of the comparator to the input of a power amplification stage supplying the amplified signal.

Embodiment of the disclosure also relate to a reference signal generation circuit configured to implement the above-described method.

According to one embodiment, the circuit comprises a comparator to compare the reference voltage with the reference signal, a logic circuit configured to adjust a numerical value as a function of a sampling of the comparison signal and of the numerical value, and a digital-analog converter to convert the adjusted numerical value into a voltage corresponding to the reference voltage.

According to one embodiment, the circuit comprises a voltage divider to generate the reference signal from a supply voltage.

According to one embodiment, the logic circuit is configured to progressively adjust the reference voltage during an initialization phase so that it reaches the reference signal, and to maintain the reference voltage constant during an operational phase.

According to one embodiment, the logic circuit is configured to detect a saturation of an amplifier biased by the reference voltage, and to adjust the reference voltage in order to avoid a saturation of the amplifier.

According to one embodiment, the logic circuit is configured to periodically readjust the reference voltage.

Embodiments of the disclosure also relate to a signal amplifier comprising a reference voltage generation circuit as described above, the reference voltage being used to bias the amplifier.

According to one embodiment, the amplifier comprises an integrator receiving on an input the reference voltage and on another input an input signal to amplify added to an amplified signal, a comparator receiving on one input the output signal of the integrator and on another input a sawtooth signal having a median voltage proportional to a supply voltage.

According to one embodiment, the amplifier comprises a power amplification stage receiving the output signal of the comparator and supplying the amplified signal, the power amplification stage may be of an H-bridge type.

According to one embodiment, the amplifier comprises an adder to add, to the output signal of the integrator, the reference signal, the sawtooth signal being centered on the reference signal, the output of the adder being connected to an input of the comparator.

According to one embodiment, the amplifier has a differential architecture.

BRIEF DESCRIPTION OF THE SEVERAL VIEWS OF THE DRAWINGS

Embodiment examples of the disclosure will be described in the following, in a non-limiting manner, in relation with the appended drawings among which.

DETAILED DESCRIPTION

Figure 5:
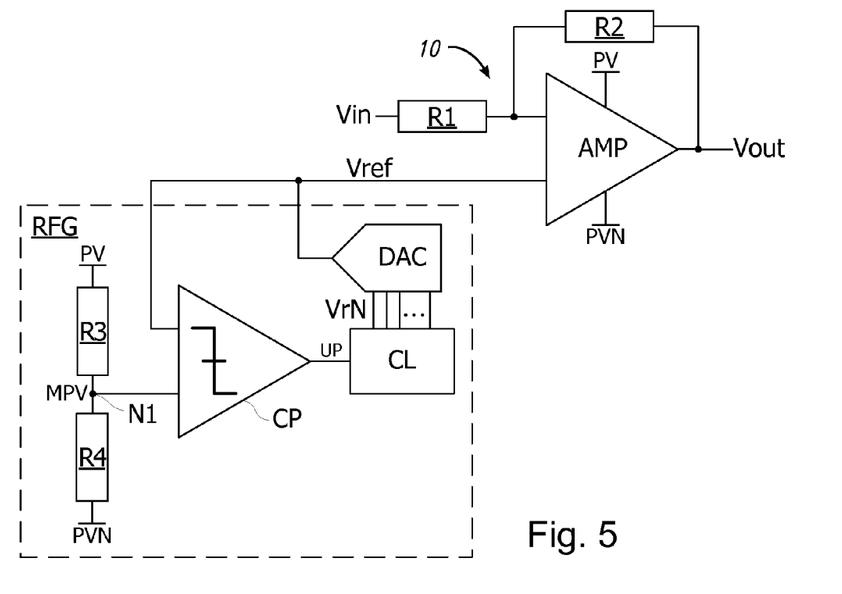

FIG. 5 shows a circuit that includes an amplification circuit 10, corresponding to the amplification circuit of FIG. 1, and a reference voltage generation circuit RFG according to one embodiment. The generation circuit RFG comprises resistors R3, R4, a digital-analog converter DAC, a logic circuit CL, and a comparator CP. The resistors R3, R4 are mounted as a voltage divider between the terminals to voltages PV and PVN of a voltage supply source to supply at their junction node N1 a voltage MPV equal to the median supply voltage, that is (PV−PVN)/2. To this end, the values of resistors R3 and R4 are substantially identical and sufficiently low in order to be easily integrated in an integrated circuit all while occupying a small semiconductor surface area. The node N1 is connected to an input of the comparator CP. The converter DAC comprises an output connected to another input of the comparator CP and supplies the reference voltage Vref of an amplification circuit. The circuit CL determines a numerical value VrN, as a function of a signal UP on output of the comparator CP and as a function of a numerical value previously supplied to the converter DAC. This value is transmitted to the converter DAC. In the example of FIG. 5, the reference voltage Vref is supplied as a bias voltage to the amplification circuit 10. In the remainder of the description, the voltage PVN may be zero or may have another value which may be negative, for example equal to −PV. In this example, the voltage MPV at node N1 is around 0 V if the resistors R3 and R4 are equal.

The logic circuit CL may be made for example with the aid of logic components or a microcontroller programmed to supply a numerical value VrN of the reference voltage Vref as a function of the output signal UP of the comparator CP.

According to one embodiment, the logic circuit CL is configured to adjust the reference voltage Vref as a function of the difference between the supply voltages PV and PVN only during an initialization phase launched upon activation of the amplification circuit. The adjustment value of the voltage Vref may be for example the maximum value of the median value (PV−PVN)/2 measured during the initialization phase. In an operational phase following the activation phase, the voltage Vref is maintained constant, independent of possible variations of supply voltages PV, PVN. The initialization phase may then be periodically launched, for example with a period of several seconds, to readjust the reference voltage Vref as a function of supply voltages PV and PVN, for example so as to set the voltage Vref at an average value (calculated over several seconds or tens of seconds) of the median voltage (PV−PVN)/2. It should be noted that the calculation of the median supply voltage is done numerically, and does not require the intervention of passive components such as a capacitor or a resistor. The period over which the calculation of this median voltage is done may be as long as necessary, without causing problems of integrating large passive components.

According to another embodiment, the logic circuit CL is configured to launch the initialization phase to readjust the reference voltage Vref when the amplification circuit is saturated. To this end, the logic circuit comprises an input to receive an amplifier saturation detection signal. This saturation detection signal may be generated on a linear amplifier by detecting when certain internal signals go out of a "normal variation range". In a class D amplifier, the amplifier saturation may be detected by observing the pulse width modulated signal. During a clock signal period, the modulated signal normally switches once from 0 to 1 and once from 1 to 0. In the case of saturation, it remains at 0 or at 1. Consequently, the amplifier is saturated if the modulated signal remained at 0 or 1 during one clock period.

According to an embodiment, the circuit CL is configured to sample the output signal of the comparator CP at a certain frequency and adjust the reference voltage by removing or adding a certain fixed number to the current numerical value VrN of the voltage Vref. This fixed number is for example a minimum number, and is removed or added to each sample taken from the output signal of the comparator, according to whether the taken sample is at 0 or 1.

Figure 5A:
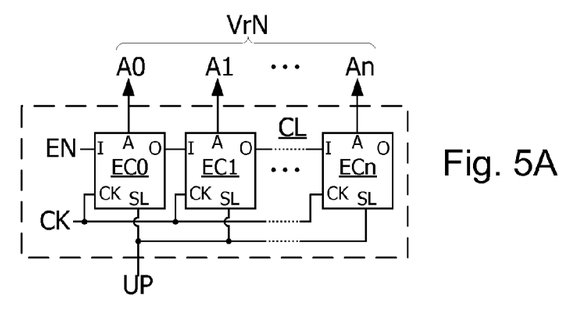

FIG. 5A shows an example circuit of the logic circuit CL. The logic circuit CL comprises as many elementary circuits EC0, EC1, . . . ECn as bits constituting the numerical value VrN supplied to the converter DAC. Each circuit EC0-ECn comprises a clock signal input receiving a clock signal CK, a selection signal SL input receiving the output signal UP of the comparator CP, an input I and an output O of the control signal, and an output A supplying a bit A0, A1, An of the numerical value VrN. The output O of each circuit EC0 to ECn-1 is connected to the input I of one of circuits EC1 to ECn. A first (EC0) of circuits EC0-ECn receives an activation signal EN on its input I.

Figure 5B:
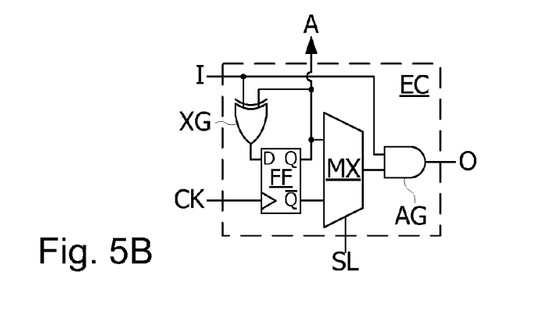

FIG. 5B shows one of circuits EC0-ECn. In FIG. 5B, the circuit EC comprises a logic gate of the AND type AG, a logic gate of the exclusive OR (XOR) type XG, a D type flip-flop FF, and a multiplexor MX. The input I of circuit EC is connected to an input of gates AG and XG. The output of the gate XG is connected to the input D of the flip-flop FF. The clock signal CK is input on the clock signal input of the flip-flop FF. The direct output Q and the inverted output $\overline{Q}$ of the flip-flop FF are connected to the inputs of the multiplexor MX. The output Q of the flip-flop FF is connected to one input of the gate XG and supplies a bit A of the numerical value VrN: VrN=(A0,A1, . . . , An). The input SL of the circuit EC is connected to a control input of the multiplexor MX. The output of the multiplexor MX is connected to an input of the gate AG, the output of which is connected to the output O of the circuit EC.

The signal UP is at 1 when the reference voltage Vref is greater than the median voltage (PV−PVN)/2 and at 0 otherwise. When the signal EN is at 0, the value VrN is maintained constant at its last value. When the activation signal EN is at 1, the multiplexor MX selects the direct output Q or the inverted output $\overline{Q}$ of the flip-flop FF depending on whether the signal SL, that is to say UP, is at 0 or at 1. It results that the value VrN is incremented or decremented at each pulse of signal CK depending on whether the signal UP is at 0 or at 1.

Figure 6:
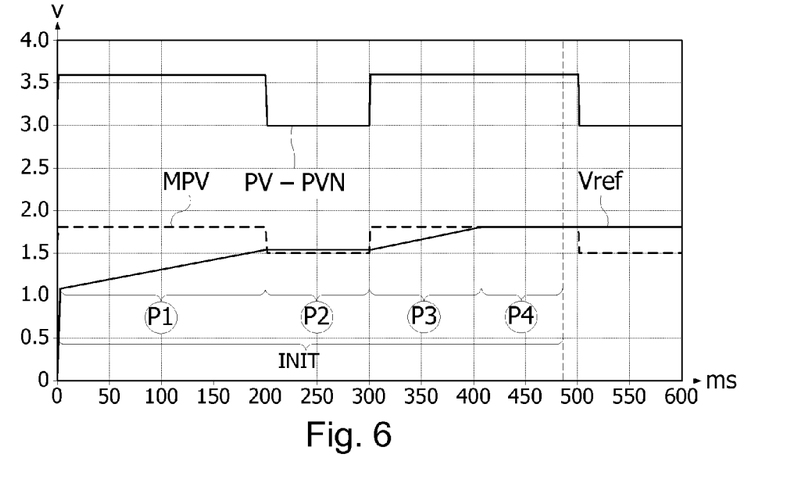
FIG. 6 shows signal variation curves as a function of time of signals in the reference voltage generation circuit, FIGS. 7 to 9 schematically show amplification circuits according to various embodiments.

FIG. 6 shows a timing diagram of voltages PV−PVN, MPV, and Vref, to illustrate the functioning of the logic circuit CL of FIG. 5A, in particular during an initialization phase INIT launched upon the activation of the amplification circuit. The voltage PV−PVN varies between approximately 3.6 V and 3 V, forming crenellations, for example during activation of other elements of the apparatus comprising the amplification circuit. The voltage MPV at node N1 varies, at the same time as the voltage PV−PVN, between 1.8 and 1.5 V. The circuit CL samples the output of the comparator CP at a certain frequency, for example several hundred Hz, and determines for each sample the value of the voltage Vref. Initially, the circuit CL sets the voltage Vref to a certain value less than the median voltage MPV. For the example of FIG. 6, this value is set at approximately 1.2 V. During a first period P1, the voltage MPV remains substantially constant, whereas the voltage Vref is less than the voltage MPV. As long as the comparator CP indicates that the voltage Vref is less than the voltage MPV, the circuit CL increments with a constant step the numerical value VrN of the voltage Vref for each sampling period. Thus, the voltage Vref progressively increases until it passes the voltage MPV. During a second period P2, the voltage MPV falls to a value of approximately 0.1 V lower than the voltage Vref. The output of the comparator CP thus goes to 0. The circuit CL maintains the voltage Vref constant at approximately 0.1 V above the voltage MPV (alternatively decreases when the output of the comparator is at 1 and increases when the output of the comparator is at 0). In other words, as the difference between the voltages Vref and MPV is less than a certain threshold, the voltage Vref is maintained constant. During a third period P3, the voltage MPV goes back to its precedent value, above the voltage Vref. The output of the comparator CP goes back to 1. The circuit CL thus increases the voltage Vref with a constant step at each sampling period. During a fourth period P4, the voltage Vref again reaches the voltage MPV. The circuit CL thus maintains the voltage Vref constant. At the end of the initialization phase INIT, the circuit CL maintains the voltage Vref constant, independently of the variations of voltages PV and PVN.

Figure 7:
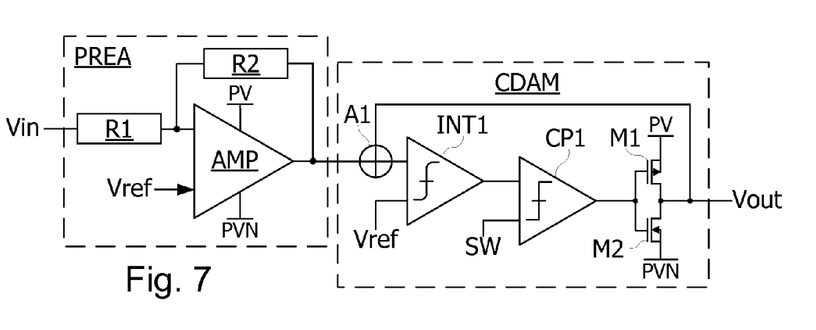

FIG. 7 shows an amplification circuit according to embodiment. In FIG. 7, the amplification circuit comprises a preamplifier PREA of the type described in reference to FIG. 1, connected to an amplifier of the class D type CDAM. The amplifier CDAM comprises a signal adder A1, an integrator INT1, a comparator CP1, and an H-bridge power amplifier stage comprising two MOS transistors M1, M2. The output of the preamplifier PREA is connected to an input of the adder A1. The output of the adder A1 is connected to an input of the integrator INT1. Another input of the integrator INT1 receives a reference voltage. The output of the integrator INT1 is connected to an input of the comparator CP1. Another input of the comparator CP1 receives a sawtooth signal SW. The output of the comparator CP1 is connected to the gate of the transistors M1, M2. The source of the n-channel transistor M1 receives the supply voltage PV. The drains of the transistors M1 and M2 (p-channel), are connected to an output terminal of the circuit CDAM supplying the amplified signal Vout, as well as to an input of the adder A1. The source of the transistor M2 receives the supply voltage PVN. The integrator INT1 compares the input signal to the output signal of the circuit CDAM and supplies a correction signal aiming to render these signals identical. The H-bridge power amplification stage allows the dynamic of the amplification circuit to be increased.

According to one embodiment, the amplifier AMP of the preamplifier PREA and the integrator INT1 receive, as a bias voltage, the reference voltage Vref generated by the circuit RFG described in reference to FIG. 5.

In a class D amplification circuit, the sawtooth signal SW is generally generated from the supply voltage (PV−PVN). The signal SW thus comprises a median component (along which the teeth of the signal SW are centered) that substantially follows the median voltage MPV. If the voltage Vref is fixed whereas the supply voltage (PV−PVN) varies, the amplified signal is subjected to distortions because the correction applied by the feedback loop by the intermediary of the adder A1 is too slow to compensate the variations of the voltage (PV−PVN). It results that in the case of an audio amplifier, the ratio PSRR cannot reach values less than −60 dB in the upper half of the audio band.

To compensate the variations of the voltage (PV−PVN), the sawtooth signal SW may be generated, in an embodiment, from the voltage Vref, so as to be centered on the voltage Vref. This solution is however not ideal because the error signal on output of the integrator INT1 also follows the variations of the supply voltage (PV−PVN). In another embodiment, the sawtooth signal SW is generated so as to be centered on the voltage Vref and to have an amplitude that follows the variations of the supply voltage (PV−PVN).

Figure 8:
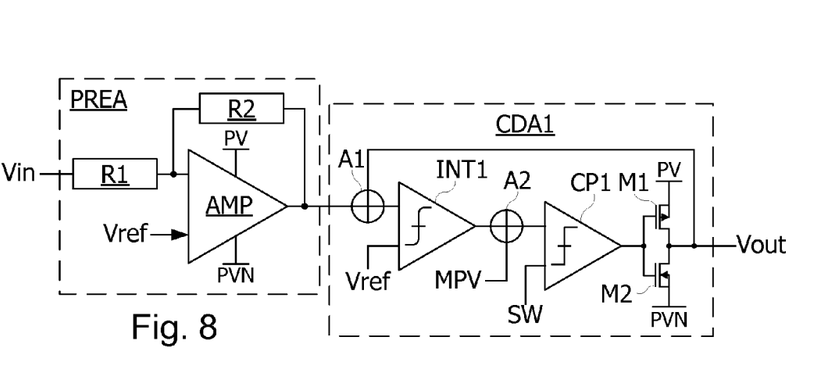

In another embodiment shown in FIG. 8, the voltage MPV is injected, by the intermediary of an adder, on output of the integrator INT1 so as to compensate in the comparator CP1 the median component of the signal SW which is substantially equal to MPV.

Thus, FIG. 8 shows an amplification circuit comprising the preamplifier PREA and an amplification circuit CDA1. The circuit CDA1 differs from the circuit CDAM in that it comprises a supplementary adder A2. Adder A2 is interposed between the output of the integrator INT1 and the input of the comparator CP1. An input of the adder A2 receives the voltage MPV at node N1 of the circuit of FIG. 5. It is to be noted that the adder A2 may be made simply by three resistors connected to the input of the comparator CP1, that is, a resistor connected to the output of the integrator INT1, a resistor connected at the supply terminal to the voltage PVN, and a resistor connected at node N1 to the voltage MPV.

Figure 9:
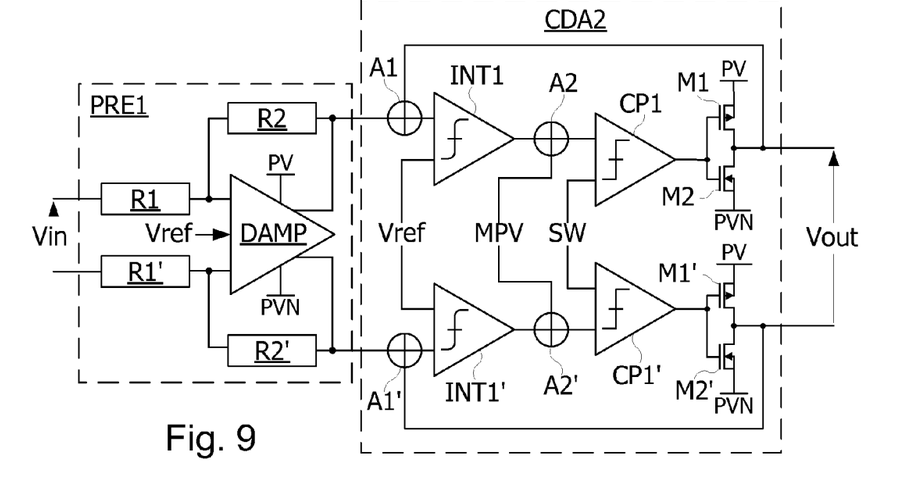

FIG. 9 shows an amplification circuit according to another embodiment. In FIG. 9, the amplification circuit comprises a preamplifier PRE1 comprising a differential amplification circuit of the type described in reference to FIG. 3, connected to a differential amplifier CDA2 of the class D type. Amplifier CDA2 differs from the amplifier CDAM of FIG. 7 in that it comprises a second amplification circuit connected to the second output of the amplifier DAMP, this second circuit being identical to the circuit CDAM. Thus, the second amplification circuit comprises a signal adder A1', an integrator INT1', a comparator CP1', and power amplification stage comprising an n-channel MOS transistor M1', and p-channel MOS transistor M2'. The second output of the amplifier DAMP is connected to an input of the adder A1'. The output of the adder A1' is connected to an input of the integrator INT1'. Another input of the integrator INT1' receives the reference voltage Vref generated by the circuit RFG described in reference to FIG. 5. The output of the integrator INT1' is linked to an input of the comparator CP1'. Another input of the comparator CP1' receives the sawtooth signal SW. The output of the comparator CP1' is connected to the gates of transistors M1', M2'. The source of the transistor M1' receives the supply voltage PV. The drains of transistors M1' and M2' are connected to a second output terminal of the circuit CDA1 and to an input of the adder A1'. The source of transistor M2' receives the supply voltage PVN. The amplified signal Vout is supplied between the first and second output terminals of the circuit CDA2.

In one embodiment, the signal SW comprises a median component substantially equal to the voltage MPV. The voltage MPV is thus injected on output of the integrators INT1, INT1' by the intermediary of adders A2, A2' interposed between the integrators INT1, INT1' and the comparators CP1, CP1'.

Figure 10:
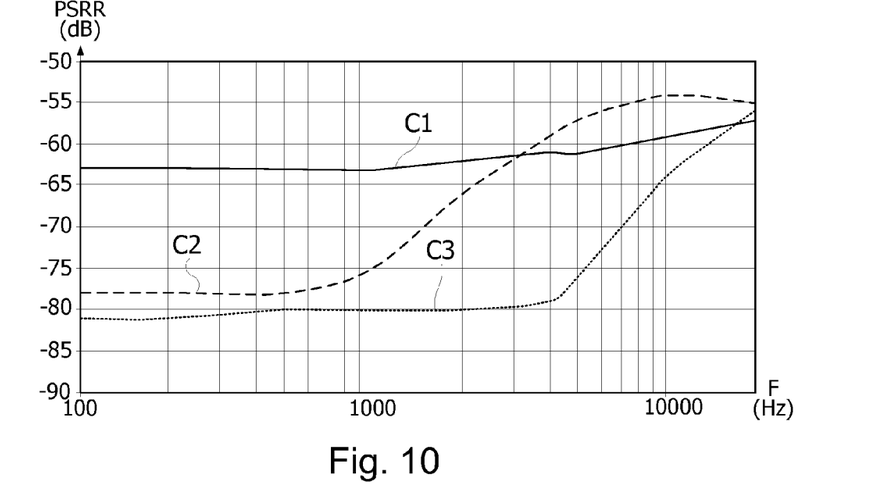
FIG. 10 shows variation curves of the ratio PSRR as a function of the frequency, obtained with the circuit of FIG. 9.

FIG. 10 shows variation curves C1, C2, C3 of the ratio PSRR of the circuit of FIG. 9 as a function of the frequency in the audio frequency band. The curve C1 shows the variations of the ratio PSRR of the circuit of FIG. 9 when the bias voltage of the amplifier DAMP and applied on input of the integrators INT1, INT1' is simply equal to MPV, and without the compensation injected by the adders A2, A2'. According to the curve C1, the ratio PSRR varies between −63 dB at low frequencies (between 100 Hz and 1 kHz) and reaches −57 dB at approximately 20 kHz. The curve C2 shows the variations of the ratio PSRR of the circuit of FIG. 9 when the reference voltage Vref generated by the circuit RFG of FIG. 5 biases the amplifier DAMP and is supplied on input of integrators INT1, INT1', and without the compensation injected by the adders A2, A2'. According to the curve C2, the ratio PSRR varies between −78 dB at low frequencies (between 100 and 600 Hz) and reaches −55 dB at approximately 20 kHz. It may be observed that the curve C2 is above the curve C1 at frequencies greater than approximately 3 kHz. The curve C3 shows the variations of the ratio PSRR of the circuit of FIG. 9 when the reference voltage Vref biases the amplifier DAMP and is supplied on input of the integrators INT1, INT1', and with the compensation injected by the adders A2, A2'. According to the curve C3, the ratio PSRR varies between −81 dB at low frequencies and −56 dB at approximately 20 kHz. It may be observed that the curve C3 remains around −80 dB at low frequencies until approximately 4 kHz, then rapidly increases, crossing curve C1 at around 17 kHz. The dispositions provided in the circuit of FIG. 9 therefore allow the ratio PSRR to be diminished.

It is to be noted that the converter DAC is equally perturbed by the variations of the supply voltage (PV−PVN). Nevertheless, it is relatively simple to obtain a converter having a ratio PSRR of −60 dB, knowing that a simple voltage divider has a ratio PSRR of −6 dB. The ratio PSRR gain conferred by the circuit RFG is therefore significant. It is to be noted that in the differential configuration of the circuit of FIG. 9, the ratio PSRR of the converter DAC is added to that of the amplification circuit PRE1-CDA2. It should also be noted that the parasitic capacitances appearing between the different nodes of the circuit and the supply also influence the ratio PSRR. The ratio PSRR is thus proportional to the frequency of variation of the supply voltage. The ratio PSRR may therefore be increased by minimizing these parasitic capacitances during the conception of the circuit.

It will clearly appear to the skilled person that the present disclosure is susceptible of diverse embodiment variations and applications. In particular, the generation circuit of the reference voltage Vref of FIG. 5 may apply to other signal amplification circuits than those previously described.

The disclosure is also not limited to the circuit described in reference to FIG. 5. Other circuits may easily be imagined without involving an inventive step. Thus, the disclosure also covers a circuit wherein the reference signal MPV issued by the voltage divider R3/R4 is converted into a numerical value by an analog-digital converter. The numerical value obtained may be modified, for example by a digital filter during certain functioning phases, and maintained constant during other functioning phases. The modified numerical value may then be converted into voltage by a digital-analog converter, the obtained voltage being the reference voltage to generate. Other circuits may also be easily implemented to generate a reference signal having a voltage equal to half of the supply voltage (PV–PVN). In certain cases, a fraction other than half may be applied to the supply voltage to generate the reference signal MPV. Equally, other signals may be used as reference signals to generate the reference voltage. Moreover, the fact of re-injecting the supply voltage divided by two PV/2 between the one or more integrators INT1, INT1' and the one or more comparators CP1, CP1', in conformance with FIG. 8 or 9, constitutes a different disclosure. Indeed, this disposition may be implemented in a class D amplifier without using the reference voltage generation circuit RFG of FIG. 5. The reference voltage Vref supplied on input of the differential amplifier DAMP and the integrators may be generated, for example, with the aid of circuit RFG1 with or without the interrupter I1. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
    an initialization phase during which a reference voltage progressively reaches a voltage of a reference signal,
    an operational phase during which the reference voltage is maintained constant, the initialization phase including:
    generating the reference voltage, the generating including:
        generating the reference signal from a voltage source,
        comparing the reference signal with the reference voltage,
        obtaining an adjusted numerical value by adjusting a numerical value as a function of a result of the comparing and of the numerical value, and
        converting the adjusted numerical value into a voltage corresponding to the reference voltage; and
    detecting a saturation of an amplifier biased by the reference voltage, and bringing the amplifier out of saturation by adjusting the reference voltage.

2. A method according to claim 1, wherein generating the reference signal includes dividing a supply voltage by a constant factor.

3. A method according to claim 1, comprising periodically readjusting the reference voltage as a function of the reference signal.

4. A method according to claim 1, comprising:
    obtaining an amplified signal by amplifying an input signal, the amplifying including:
        obtaining a first added signal by adding the input signal and the amplified signal;
        inputting, to a first input of an integrator, the first added signal,
        inputting the reference voltage to a second input of the integrator,
        coupling an output signal of the integrator to first input of a comparator,
        receiving on a second input of the comparator a sawtooth signal, and
        obtaining the amplified signal from an output signal of the comparator.

5. A method according to claim 4, comprising generating the sawtooth signal centered on the reference signal, obtaining a second added signal by adding the reference signal to the output signal of the integrator, and inputting the second added signal to the first input of the comparator.

6. A method according to claim 4, comprising step of supplying the output signal of the comparator to an input of a power amplification stage supplying the amplified signal.

7. A reference signal generation circuit, comprising:
    a comparator configured to provide a comparison signal by comparing a reference voltage with a reference signal,
    a logic circuit configured to adjust a numerical value as a function of a sampling of the comparison signal and of the numerical value, and
    a digital-analog converter configured to convert the adjusted numerical value into a voltage corresponding to the reference voltage,
    wherein the logic circuit is configured to:
        progressively adjust the reference voltage during an initialization phase so that the reference voltage reaches the reference signal, and to maintain the reference voltage constant during an operational phase;
        detect a saturation of an amplifier biased by the reference voltage; and
        bring the amplifier out of saturation by adjusting the reference voltage.

8. A circuit according to claim 7, comprising a voltage divider configured to generate the reference signal from a supply voltage.

9. A circuit according to claim 7, wherein the logic circuit is configured to periodically readjust the reference voltage.

10. A signal amplifier circuit, comprising
    a reference voltage generation circuit that includes:
        a first comparator configured to provide a comparison signal by comparing a reference voltage with a reference signal,
        a logic circuit configured to adjust a numerical value as a function of a sampling of the comparison signal and of the numerical value, and
        a digital-analog converter configured to convert the adjusted numerical value into a voltage corresponding to the reference voltage; and
    an amplifier configured to be biased by the reference voltage,
    wherein the logic circuit is configured to progressively adjust the reference voltage during an initialization phase so that the reference voltage reaches the reference signal, and to maintain the reference voltage constant during an operational phase.

11. An amplifier circuit according to claim 10, comprising:
an integrator having a first input configured to receive the reference voltage, a second input configured to receive an added signal based on an input signal and an amplified signal, and an output configured to supply and integrator signal; and
a second comparator having a first input coupled to the output of the integrator and a second input configured to receive a sawtooth signal having a median voltage proportional to a supply voltage.

12. An amplifier circuit according to claim 11, comprising a power amplification stage having an input coupled to an output of the comparator and configured to supply the amplified signal.

13. An amplifier circuit according to claim 12, wherein the power amplification stage includes an H-bridge amplification stage.

14. An amplifier circuit according to claim 11, comprising an adder having a first input coupled to the output of the integrator, a second input configured to receive the reference signal, and an output coupled to the first input of the second comparator.

15. An amplifier circuit according to claim 10, wherein the amplifier has a differential architecture.

16. A circuit, comprising:
a reference voltage generating circuit configured to generate a reference voltage, the reference voltage generating circuit including:
generating means for generating a reference signal from a voltage source,
first comparing means for comparing the reference signal with the reference voltage,
adjusting means for obtaining an adjusted numerical value by adjusting a numerical value as a function of a result of the comparing and of the numerical value,
converting means for converting the adjusted numerical value into a voltage corresponding to the reference voltage, and
a logic circuit configured to control the adjusting means to progressively adjust the reference voltage during an initialization phase so that the reference voltage reaches the reference signal, and to maintain the reference voltage constant during an operational phase, wherein the adjusting means include detecting means for detecting a saturation of an amplifier biased by the reference voltage, and means for bringing the amplifier out of saturation by adjusting the reference voltage.

17. A circuit according to claim 16, wherein the adjusting means are for adjusting, during the initialization phase, the reference voltage to progressively reach the reference signal, and for maintaining constant the reference voltage during the operational phase.

18. A circuit according to claim 16, wherein the adjusting means are for periodically readjusting the reference voltage as a function of the reference signal.

19. A circuit according to claim 16, comprising:
amplifying means for obtaining an amplified signal by amplifying an input signal, the amplifying means including:
adding means for obtaining a first added signal by adding the input signal and the amplified signal;
integrating means for provided an integrator output signal based on the first added signal and the reference voltage,
second comparing means for providing a comparison signal based on the integrator output signal and a sawtooth signal, and
means for obtaining the amplified signal from the comparison signal.

20. A circuit according to claim 19, comprising:
means for generating the sawtooth signal centered on the reference signal, and
means for obtaining a second added signal by adding the reference signal to the output signal of the integrator, and inputting the second added signal to the comparison means.

21. A method comprising:
an initialization phase during which a reference voltage progressively reaches a voltage of a reference signal,
an operational phase during which the reference voltage is maintained constant, the initialization phase including:
generating the reference voltage, the generating including:
generating the reference signal from a voltage source,
comparing the reference signal with the reference voltage,
obtaining an adjusted numerical value by adjusting a numerical value as a function of a result of the comparing and of the numerical value, and
converting the adjusted numerical value into a voltage corresponding to the reference voltage; and
obtaining an amplified signal by amplifying an input signal, the amplifying including:
obtaining a first added signal by adding the input signal and the amplified signal;
inputting, to a first input of an integrator, the first added signal,
inputting the reference voltage to a second input of the integrator,
coupling an output signal of the integrator to first input of a comparator,
receiving on a second input of the comparator a sawtooth signal, and
obtaining the amplified signal from an output signal of the comparator.

22. A method according to claim 21, comprising generating the sawtooth signal centered on the reference signal, obtaining a second added signal by adding the reference signal to the output signal of the integrator, and inputting the second added signal to the first input of the comparator.

23. A method according to claim 21, comprising supplying the output signal of the comparator to an input of a power amplification stage supplying the amplified signal.

24. A circuit, comprising:
a voltage generating circuit configured to generate a reference voltage, the voltage generating circuit including:
generating means for generating a reference signal from a voltage source,
first comparing means for comparing the reference signal with the reference voltage,
adjusting means for obtaining an adjusted numerical value by adjusting a numerical value as a function of a result of the comparing and of the numerical value,
converting means for converting the adjusted numerical value into a voltage corresponding to the reference voltage;
a logic circuit configured to control the adjusting means to progressively adjust the reference voltage during an initialization phase so that the reference voltage reaches the reference signal, and to maintain the reference voltage constant during an operational phase; and amplifying means for obtaining an amplified signal by amplifying an input signal, the amplifying means including:
- adding means for obtaining a first added signal by adding the input signal and the amplified signal,
- integrating means for provided an integrator output signal based on the first added signal and the reference voltage,
- second comparing means for providing a comparison signal based on the integrator output signal and a sawtooth signal, and
- means for obtaining the amplified signal from the comparison signal.

25. A circuit according to claim 24, comprising:

means for generating the sawtooth signal centered on the reference signal, and means for obtaining a second added signal by adding the reference signal to the output signal of the integrator, and inputting the second added signal to the comparison means.

* * * * *